United States Patent [19]
Kaplan

[11] 4,180,782
[45] Dec. 25, 1979

[54] PHANTOM FULL-BRIDGE AMPLIFIER
[75] Inventor: Leonard A. Kaplan, Fords, N.J.
[73] Assignee: RCA Corporation, New York, N.Y.
[21] Appl. No.: 912,394
[22] Filed: Jun. 5, 1978
[51] Int. Cl.[2] .............................................. H03F 3/26
[52] U.S. Cl. .................................. 330/276; 330/195; 330/271
[58] Field of Search ............... 330/195, 196, 122, 276, 330/271; 179/1 A

[56] References Cited
U.S. PATENT DOCUMENTS

| | | | |
|---|---|---|---|
| 2,763,732 | 9/1956 | Rockwell | 330/81 X |
| 2,787,672 | 4/1957 | Crosby, Jr. | 330/71 |
| 2,910,689 | 10/1959 | Grace | 330/276 X |
| 2,932,800 | 4/1960 | Bereskin | 330/270 |
| 3,439,285 | 4/1969 | Mercola | 330/259 |
| 4,096,443 | 6/1978 | Gilson | 330/276 X |

OTHER PUBLICATIONS

Peppercorn, "A High-Quality Transistor Receiver", *Proceedings of the I.R.E. Australia*, Dec. 1957, pp. 457-462.

*Primary Examiner*—James B. Mullins
*Attorney, Agent, or Firm*—P. J. Rasmussen; A. L. Limberg; A. J. Jacobson

[57] ABSTRACT

The collectors of a pair of transistors operated quasi-linearly in push-pull are coupled to their load by an autotransformer winding, center-tapped to receive operating potential. The configuration simulates a full-bridge amplifier with operating potential twice as large, insofar as maximum output power capability is concerned.

4 Claims, 1 Drawing Figure

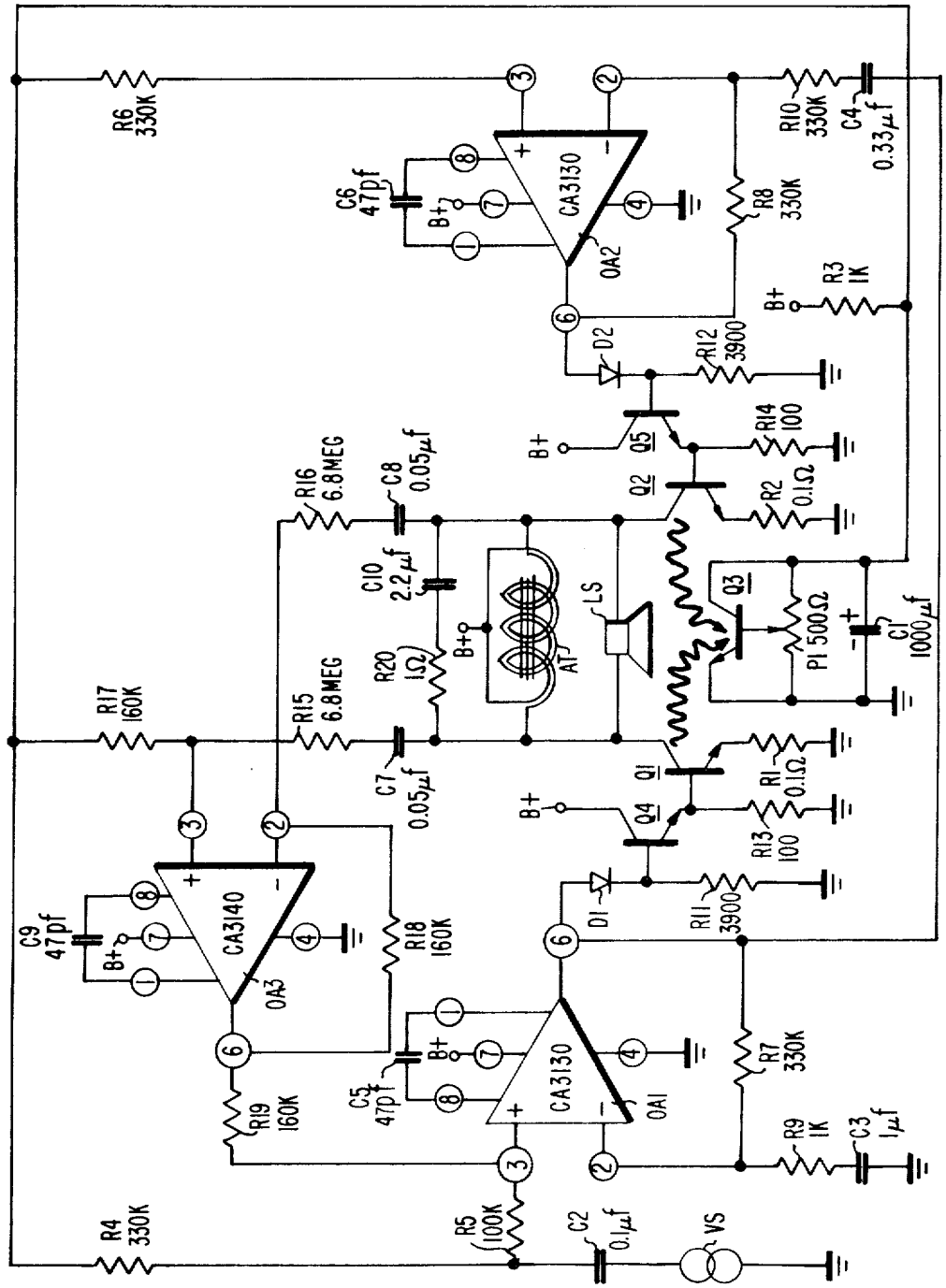

PHANTOM FULL-BRIDGE AMPLIFIER

The present invention relates to a new type of quasi-linear transistor power amplifier called herein the "phantom full-bridge amplifier".

"Quasi-linear" amplifiers use a plurality of transistors operating in Class AB or B—i.e., operating linearly only over a portion of input signal excursions—but cooperating to provide amplification that overall is linear. Commonly, quasi-linear amplifiers use a pair of transistors, with collector-to-emitter paths serially connected across a supply of operating voltage, to drive the load push-pull, operating in the so-called "half-bridge" configuration. Alternatively, a quasi-linear amplifier may be a "full-bridge" configuration, using two "half-bridge" configurations driven in anti-phase to drive opposite ends of a load impedance. The impedance of its load and the magnitude of its operating voltage define the maximum power available from a full-bridge amplifier.

In the past, if one wished greater maximum power than afforded by the full-bridge amplifier, he would go to conventional push-pull amplifier configurations in which the output transistors drive the primary winding of an output transformer, the secondary winding of which is connected to the load. Overall linearizing feedback for such an amplifier is conventionally taken from the secondary winding of the output transformer or from a tertiary winding especially for that purpose. One might seek to use such operation, for example, where one wished to provide a 60 W or so amplifier for driving conventional-impedance loudspeakers from the 12-14 V. operating voltage afforded by a typical automotive lead-acid storage battery.

This approach is taken at the cost of some amplifier efficiency, since the IR losses in the output circuit of the transistor amplifier additionally include output transformer copper losses and increase with the square of current. The output transformer tends to be bulky and heavy, tends to present problems with its electromagnetic field interacting with other electromagnetic fields, and tends to introduce restrictions in the bandwidth of the amplifier. These bandwidth restrictions cause phase-shifted responses at high and low frequencies which make it difficult to use linearizing feedback that includes the output transformer as well as the output transistors, without risk of undesirable regenerative effects. These shortcomings of amplifiers using output transformers are well known and are so much a problem that designers tend to avoid such designs in favor of a full-bridge amplifier configuration if sufficient maximum power can be so obtained, even if such avoidance involves such undesirable compromises as having to use non-standard amplifier load impedances or more expensive or elaborate operating voltage supplies. E.g., where one wants a 60 W high-fidelity amplifier powered from a typical automotive lead-acid storage battery, one might consider a low-impedance loudspeaker or a dc-to-dc converter for obtaining a higher operating voltage.

The present inventor has found a new power amplifier configuration that can provide, for a given operating voltage, output power equivalent to that of a full-bridge amplifier operated at twice that voltage. In this so-called "phantom full-bridge" configuration the transistor in each half-bridge position of the full-bridge configuration which would connect to the higher operating voltage is dispensed with. The place of these actual transistors is taken by an autotransformer winding parallelling the load and having a center-tap connected to receive operating voltage. The autotransformer in effect provides "phantom" transistors for completing the full-bridge amplifier configuration. The "phantom" transistors are provided by the actual transistors that have their collector electrodes direct coupled to the first and second ends of the load, respectively, having their collector electrodes transformer-coupled with phase-reversal to the second and first ends of the load respectively.

The sole FIGURE of the drawing is a schematic diagram of a "phantom full-bridge amplifier" embodying the present invention.

The phantom full-bridge amplifier configuration, shown driving a load means consisting of a loudspeaker LS, comprises common-emitter amplifier connections of Q1 and Q2 and a center-tapped autotransformer winding AT. Q1 and Q2 are operated in push-pull with each other. Under quiescent conditions the positive operating potential B+ applied to the center-tap of autotransformer winding AT is coupled through the low d-c resistance of winding AT to provide quiescent potentials substantially equal to B+ to the collector electrodes of Q1 and Q2, which are respectively connected to first and second terminals of loudspeaker LS. Insofar as signal variations in the collector currents of Q1 and Q2 are concerned, the collector electrodes of Q1 and Q2 are direct coupled to first and second terminals respectively of the loudspeaker LS and are coupled in reverse-phasing to those second and first terminals, respectively, of the loudspeaker LS by the autotransformer action of winding AT.

During excursions of signal in a sense such as to render Q1 more conductive and Q2 less conductive, the autotransformer action of winding AT transforms collector current flow from transistor Q1 to simulate the flow of current from a phantom transistor in half-bridge amplifier configuration with Q2. The conduction of Q1 pulls the first terminal of loudspeaker LS from its quiescent B+ voltage towards ground potential, while the phantom transistor, in effect provided by the collector current variation of Q1 being transformed to opposite phasing by autotransformer winding AT, pushes the second terminal of loudspeaker LS from its quiescent B+ voltage towards a voltage of twice that value, as referred to ground potential.

During excursions of signal in a sense such as to render Q1 less conductive and Q2 more conductive, the autotransformer action of winding AT transforms collector flow from transistor Q2 to simulate the flow of current from a phantom transistor in half-bridge amplifier configuration with Q1. The phantom transistor, in effect provided by the collector current variation of Q2 being transformed to opposite phasing by autotransformer winding AT, pushes the first terminal of loudspeaker LS from its quiescent B+ voltage towards a voltage twice that value, as referred to ground potential, while the conduction of Q2 pulls the second terminal of loudspeaker LS from its quiescent B+ voltage towards ground potential.

Thus the first and second terminals of loudspeaker LS each experience voltage excursions approaching twice B+ voltage, in opposite phasing to each other. Voltage excursions four times B+ voltage are available across the loudspeaker LS, just as would be the case were one to use a full-bridge amplifier configuration with an operating voltage (2B+) twice as large as the B+ operating voltage. This provides a maximum output power capability four times that of a full-bridge amplifier configuration operated with the same B+ operating voltage. In the context of operating a 4 ohm high-fidelity loudspeaker from the 12-14 V. operating voltage available from a typical automotive lead-acid storage battery, one is able to obtain a full 60 W of power as compared to the 15 W. available to drive a loudspeaker from conventional transformerless full-bridge amplifier designs. By going to a 2 ohm speaker one can drive up to a quarter-kilowatt of power into the loudspeaker; capability for operation with such high power levels is desirable where one uses extreme bass boost to provide flat low-frequency response at respectable listening level from a small loudspeaker in a small enclosure, as likely will be done in high-fidelity systems for automobile use.

Consider now how the shortcomings of previous amplifiers using transformers to couple to their loads are in substantial measure avoided in the phantom full-bridge amplifier. A center-tapped autotransformer winding in a step-up transformer arrangement need provide transformer coupling for only half the output power to its load, the rest being direct coupled. The current flowing through either half of a center-tapped autotransformer winding is equal in magnitude to the load current and is only half as large as the collector current of the output transistor. This permits reducing copper losses by a factor of four as compared to the primary winding of a double-wound transformer, if that primary be the same wire size as the autotransformer winding, in addition to eliminating the copper losses associated with a secondary, load winding. This would result not only in better transformer efficiency, but also in better regulation in a voltage step-up arrangement. Generally, however, the advantage is taken in a different form, choosing to reduce the size of the autotransformer to bring its volt-ampere rating into line with that of the double-wound transformer that might alternatively couple Q1 and Q2 to the loudspeaker LS or other load means.

The smaller size of the autotransformer for given voltage-ampere rating, and absence of a secondary load winding to which close coupling must be maintained, make it easier to maintain close coupling between its input and output circuits. But further, very close coupling between the halves of a center-tapped autotransformer winding is much more readily achieved than in a double-wound step-up transformer, since the halves of the center-tapped autotransformer winding, being equal in length, may readily be concurrently wound by bifilar or other multifilar winding techniques. The autotransformer AT is illustrated in the drawing as being bifilar. Such multifilar windings drastically reduce leakage inductance at the expense of some increase in interwinding capacitance, improving the high frequency response of the transformer, and are preferred. The tight coupling between the halves of the autotransformer winding is important to obtaining the advantages of the phantom full-bridge amplifier configuration; this tight coupling contrasts, for example, with the very loose coupling between winding halves exhibited by the center-tapped voice coils of some special-design loudspeakers.

As noted in pp. 206-208 of *Transformers for Electronic Circuits* by Nathan R. Grossner, published in 1967 by McGraw Hill, Inc., the inclusion of a transformer in the overall negative feedback connection used to linearize a transistor amplifier can adversely affect its stability against self-oscillation. That text advises that wherever possible negative feedback should be taken from the primary winding of a coupling transformer to promote stability against regenerative effects. At the same time considerable distortion (as much as 5% harmonic distortion) occurs in the matching transformer of a conventional push-pull amplifier coupled to its load through a two-winding transformer, so one is presented with a conflicting need to derive the voltage for the overall negative feedback from across the load. In the phantom full-bridge amplifier one has the advantage that, since the autotransformer winding halves can be so tightly coupled to each other, the connections to the load are in effect at the connections to the transformer primary. This permits one to derive the voltage for the overall negative feedback from across the load, while avoiding in substantial measure the phase shift problems associated with coupling through a transformer with high leakage inductance which tends to self-resonate with distributed interwinding capacitance at the upper-frequency end of the transformer bandwidth.

The phantom full-bridge amplifier configuration is advantageous over prior art circuits in which a single Class A amplifier drives a load, such as a loudspeaker, through a step-up autotransformer, inasmuch as the symmetrical direct components of collector current are supplied by transistors Q1 and Q2 to the respective halves of the autotransformer winding AT. So then, as in the primary winding of the double-wound transformer in a conventional Class AB push-pull amplifier, there is no resultant direct component of magnetization current in the autotransformer winding, and one need not use a large amount of iron in the transformer core in order to avoid its saturation.

The details of circuitry for providing quiescent base-emitter junction biasing for transistors Q1 and Q2 and for supplying Q1 and Q2 with push-pull drive signals will now be discussed. The emitters of Q1 and Q2 are connected to a reference voltage ground by emitter degeneration resistors R1 and R2, respectively. To keep amplifier efficiency high, R1 and R2 will normally be of sufficiently low resistance that it is necessary to supply temperature-dependent quiescent base potentials to Q1 and Q2 to avoid thermal runaway adversely affecting their Class AB operation.

An original supply of temperature-dependent potentials is built around an NPN transistor Q3 with which Q1 and Q2 (as indicated by the wavy arrows), are closely thermally coupled—e.g., by sharing a common heat sink—and further includes resistor R3, potentiometer P1, and capacitor C1. R3 connects the collector of Q3 to B+, and Q3 is provided direct-coupled collector-to-base feedback by the resistive potential divider action of P1. P1 has its body connected between the collector and emitter of Q3, and its slider-tap connected to the base of Q3. As well known, this feedback connection maintains the quiescent collector potential $V_{CQ3}$ of Q3 at a value which is equal to its emitter-to-base potential $V_{BEQ3}$ times the factor by which the resistive potential divider formed by potentiometer P1 divides potential. A capacitor C1 by-passes the collector of Q3 to ground, preventing intercoupling of signal variations between the circuits biased by $V_{CQ3}$.

$V_{CQ3}$ is not applied to the bases of Q1 and Q2 directly, but rather via high-gain differential-input amplifiers—that is, operational amplifiers or "op amps". $V_{CQ3}$ is applied to the non-inverting input terminals (pins 3) of operational amplifiers OA1 and OA2 via the series connection of resistors R4 and R5 and via resistor R6, respectively. Resistor R7 and R8 provide d-c feedback connection between the output terminals (pins 6) and inverting input terminals (pins 2) of op amp OA1 and of op amp OA2, respectively. These feedback connections do not have means for dividing direct potential associated with them, so they operate to maintain the quiescent direct potentials at pins 6 of op amps OA1 and OA2 equal, practically speaking, to $V_{CQ3}$. The quiescent potential at pins 6 of op amp OA1 is translated two junction offset potentials towards ground by the potential offsetting action of forward-biased diode D1 and by the emitter follower action of common-collector amplifier transistor Q4, then applied to the base of Q1. The quiescent potential at pin 6 of op amp OA2 is translated two junction offset potentials towards ground by the potential-offsetting action of forward biased diode D2 and by the emitter-follower action of common-collector amplifier transistor Q5, then applied to the base of Q2. The temperature-dependency of $V_{CQ3}$ compensates for the temperature-dependency of the offset potentials across D1 and the base-emitter junction of Q4 as well as the offset potential $V_{BEQ1}$ across the base-emitter junction of Q1 and, by the same token, for the temperature dependency of the offset potentials across D2 and the base-emitter junction of Q5, as well as the offset potential $V_{BEQ2}$ across the base emitter junction of Q2. In the amplifier shown in the drawing, potentiometer P1 is adjusted such that $V_{CQ3}$ will have a value substantially three times its emitter-to-base offset potential $V_{BEQ3}$.

A distinctive feature then of the amplifier shown in the drawing is that the temperature dependent potential for application to the bases of the output transistors is applied via the agency of op amps, having respective d-c feedback connections between their output and inverting input terminals for relating their output voltages to the temperature-dependent potential applied to their non-inverting input terminals. This is an alternative to the prior art practice of using the center-tapped secondary winding of a coupling transformer for this purpose.

Having replaced the coupling transformer by the op amps OA1 and OA2, insofar as concerns biasing of the output transistors Q1 and Q2, one is faced with the problem of supplanting the coupling transformer insofar as concerns its functioning to apply antiphase drive signal, respectively, to the base of Q1 and to the base of Q2. In considering this problem, connection to the non-inverting input terminal (pin 3) of op amp OA1, other than through resistor R5, will be assumed not to exist.

Input signal voltage is supplied from a voltage source VS coupled to the non-inverting input terminal (pin 3) of op amp OA1 via a path through coupling capacitor C2 and resistor R5. This would case greatly amplified signal voltage at the output terminal (pin 6) of op amp OA1 if it were operated open-loop. However, a degenerative feedback connection for signal variations is provided by the potential divider action between resistor R7 and the series combination of resistor R9 and capacitor C3. C3 is of relatively low impedance compared to R9 down to the lower signal frequencies of interest in the amplifier. The voltage gain between the non-inverting-input and output terminals of op amp OA1 is constrained to be substantially equal to $(R_7/R_9)+1$, where $R_7$ and $R_9$ are the respective resistances of resistors R7 and R9, it being well known that the voltage gain of an op amp between its non-inverting-input and output terminals is essentially equal to the factor by which output signal appearing at its output terminal is divided to provide feedback signal for application to its inverting input terminal. Op amp OA1, then, in addition to providing direct coupling from the collector circuit of Q3 to the anode of diode D1 for applying $V_{CQ3}$ to the anode of diode D1, provides amplified response to the input signal from signal source VS of the anode of diode D1, which response is of the same phase as the input signal.

Op amp OA2 is arranged to function as an inverting amplifier as well as for applying $V_{CQ3}$ to the anode of diode D2. That is, it provides amplified response at its output terminal to the input signal, which response is of the same amplitude as the amplified response op amp OA1 provides at its output terminal, but of opposite phase. To this end, the amplified response at the output terminal (pin 6) of op amp OA1 is applied to the inverting input terminal (pin 2) of op amp OA2 via the series combination of a coupling capacitor C4 and a resistor R10 having a resistance of the same value as that of resistor R8 connecting the output terminal (pin 6) of op amp OA2 to its inverting input terminal (pin 2).

Capacitor C5 connecting pins 1 and 8 of op amp OA1 capacitor C6 connecting pins 1 and 8 of op amp OA2, and capacitor C9 connecting pins 1 and 8 of op amp OA3, are stabilizing capacitors for determining the primary roll-off frequencies of the op amps. Op amps OA1, OA2, and OA3 have their positive supply voltage connections at their pins 7. Their pins 4 are connected to ground, which is in effect a negative supply potential for op amps OA1 and OA2 as compared to their quiescent input potentials at their pins 2 and 3 and their quiescent output potentials at their pins 6. It is to accommodate a sufficiently large quiescent output potential between pins 4 and 6 of each of the op amps OA1 and OA2 to accommodate expected output signal swings without clipping, that diodes D1 and D2 are used in direct coupling the output terminals of op amps OA1 and OA2 to the bases of Q4 and Q5 respectively. Diodes D1 and D2 are maintained in forward bias by connecting their cathodes to ground via resistors R11 and R12, respectively; and the base-emitter junctions of Q4 and Q5 are maintained in forward bias by connecting their respective emitters to ground via resistors R13 and R14, respectively. The forward-biased diodes D1 and D2 translate the signal potentials at the output terminals of op amps OA1 and PA2 towards ground potential without appreciably attenuating them prior to their application to the base electrodes of Q4 and Q5, respectively.

When the input signal from voltage source VS is zero-valued, the setting of potentiometer P1 can be adjusted to provide the $V_{CQ3}$, around $3V_{BEQ3}$ in value, that fixes the desired idling currents through the collector-to-emitter paths of Q1 and Q2 to condition them for Class AB operation. A positive excursion of input signal from voltage source VS causes an amplified positive excursion of signal at the output terminal (pin 6) of op amp OA1, which output terminal is coupled by diode D1 and emitter-follower Q4 to the base electrode of Q1, to increase its conduction above idling current level. The positive excursion of input signal causes an amplified negative excursion of input signal at the output terminal (pin 6) of op amp OA2. This reduces the emitter potential of emitter-follower Q5 so that Q2 has insufficient base potential to maintain conduction even at the relatively small idling current level. The conduction of Q1 pulls the potential at its collector and the first terminal of loudspeaker LS towards ground. This negative-going potential as applied to one end of the center-tapped autotransformer winding AT causes a positive-going potential at the other end, which is connected to the second terminal of loudspeaker LS, Q2 being insufficiently conductive to resist the potential at its collector electrode going more positive.

On the other hand, a negative excursion of input signal from voltage source VS causes an amplified negative excursion of signal at the output terminal (pin 6) of op amp OA1. This is coupled through diode D1 and emitter-follower Q4 to the base electrode of Q1 to reduce the base potential of Q1 below the value sufficient to maintain its conduction even at the relatively small idling current level. The negative excursion of input signal causes a positive amplified excursion of signal at the output terminal (pin 6) of op amp OA2, coupled by diode D2 and emitter-follower Q5 to the base electrode of Q2, to increase its conduction above idling current level. The conduction of Q2 pulls the potential at its collector and the second terminal of loudspeaker LS towards ground. This negative-going potential is reversed in phase by autotransformer winding AT to raise the potential at the first terminal of loudspeaker LS, Q1 being insufficiently conductive to resist the potential at its collector electrode going more positive.

The autotransformer winding AT could have a secondary winding associated with it to develop a single-ended feedback signal to be coupled back to the input terminal (pin 3) of op amp OA1 to complete an overall feedback loop for linearizing the complete amplifier. Such a winding might be wound trifilar with the two halves of the center-tapped autotransformer winding AT to obtain close coupling that would keep phase-shift low, to reduce tendencies towards undesired regeneration in the overall feedback loop.

A preferable practice, however, is to use a balanced-to-single-ended signal converter arrangement using transistors to avoid the phase shift problems associated with a double-wound transformer. The signal converter must be of a type able to accept balanced input signal voltage swings over a range twice the B+ operating voltage, owing to the large voltage swings at the ends of the autotransformer winding AT. The particular balanced-to-single-ended signal converter shown comprises op amp OA3; resistors $R_{15}$, $R_{16}$, $R_{17}$, and $R_{18}$ and their interconnections. The operation of this type of signal converter is described in Chapter V of *Modern Operational Circuit Design* by John I. Smith, published by John Wiley and Sons Inc. (New York)—and in Chapter 6, Section 6.1.1 of *Operational Amplifiers—Design and Applications*, by the staff of Burr Brown, edited by Graeme, Tobey and Huelsman and published by McGraw Hill Book Co. (New York)—which descriptions are incorporated herein by reference. The voltages at the collector electrodes of Q1 and Q2 are separated from their respective direct components by blocking capacitors $C_7$ and $C_8$, respectively, and applied to the non-inverting and inverting input connections of the balanced-to-single-ended signal converter. Response to the difference of these voltages separated from their respective direct components appears at the output terminal (pin 6) of op amp OA3.

This response is superimposed on a quiescent potential equal to $V_{CEQ3}$, facilitating the output terminal (pin 6) of op amp OA3 being direct coupled to the non-inverting input terminal (pin 3) of op amp OA1 by a resistor $R_{19}$, without affecting the biasing of OA1 in any substantial degree. The response of OA3 is divided by the potential divider action of resistors R19 and R5 and applied to the non-inverting input terminal (pin 3) of op amp OA1. The reason for the $V_{CEQ3}$ quiescent potential at the output terminal (pin 6) of op amp OA3 is: resistor R18 connects the output terminal (pin 6) of OA3 to its inverting input terminal (pin 2) completing a direct coupled feedback loop stabilizing the quiescent voltages at those terminals of the $V_{CEQ3}$ quiescent potential applied to the non-inverting input terminal (pin 3) from the collector electrode of Q3 via resistor R17.

One may alternatively replace C7 and C8 with direct connections and insert a blocking capacitor in series with R19. One might also use a single-ended overall feedback connection, taken from the end of the load LS to which the collector electrode of Q1 connects, but this practice increases even-harmonic distortion owing to the reduction of even-harmonic distortion caused by Q1 which would normally act in the push-pull connection to cancel even-harmonic distortion caused by Q2.

Capacitor C10 and resistor R20 are connected across the autotransformer winding AT to provide the dominant high-frequency roll-off in the overall feedback loop, so the loop is unconditionally stable against self-oscillatory tendencies.

Even higher output power capability for given operating potential is achievable by connecting the collector electrodes of Q1 and Q2, not to the ends of the halves of autotransformer winding AT remote from their connection to B+, but rather to intermediate points in the half windings equally remote from the center-tap connection to B+. For example, a quadrafilar winding might be used as a 1:4 step-up transformer to the load.

The amplifier shown uses bipolar transistors Q1 and Q2 in common-emitter configuration with their base, collector and emitter electrodes corresponding to the input, output and common electrodes, respectively, of the output transistor means each forms. Bipolar transistors Q1 and Q2 may each be replaced by a field-effect transistor in common-source configuration with its gate, drain and source electrodes corresponding to the input, output and common electrodes, respectively, of the output transistors means it forms. Common-base and common-collector amplifier configurations using bipolar transistors and common-gate and common-drain configurations using field effect transistors may also be used as output transistor means. The scope of the ensuing claims should be construed reflective of these possible alternatives.

What is claimed is:

1. A phantom full-bridge amplifier for supplying oppositely-phased push-pull drives to first and second ends of a load, for permitting the first and second ends of said load to be driven sufficiently to provide an output voltage across said load with a range substantially at least four times as large as a restricted difference available between reference and operating potentials, said phantom full-bridge amplifier comprising:
   first and second supply terminals for receiving said operating and reference potentials, respectively;
   first and second load terminals for connection to the first and second ends, respectively, of said load;
   first and second transistor means of the same conductivity type each having respective input and output and common electrodes;
   means for maintaining the common electrodes of said first and second transistor means substantially at said reference potential, including first direct current conductive means connecting the common electrode of said first transistor means to said second supply terminal, and second direct current conductive means connecting the common electrode of said second transistor means to said second supply terminal;

push-pull driver means responsive to an input signal for supplying push-pull signals to the input electrodes of said first and second transistor means, said push-pull driver means being of a type such that said push-pull signals are developed responsive to said input signal by transformerless means for avoiding phase shift through said push-pull driver means such that excursions of said input signal in a first sense render said first transistor means more conductive and said second transistor means less conductive, such that sufficiently large excursions of input signal in said first sense render said second transistor means non-conductive, such that excursions of input signal in a second sense opposite to the first sense render said first transistor means less conductive and said second transistor means more conductive, such that sufficiently large excursions of input signal in said second sense render said first transistor means nonconductive; and means responsive substantially solely to the currents flowing through the output electrodes of said first and second transistor means for providing oppositely-phased push-pull drives at said first and second load terminals, respectively, essentially consisting of a step-up autotransformer winding having a first half connected between said first load terminal and said first supply terminal, having a second half connected between said second load terminal and said first supply terminal, and having the output electrodes of said first and second transistor means respectively connected to points in its first and second halves equally remote from their connections to said first supply terminal and sufficiently so that the self inductance thereof is sufficient for producing an output voltage of said range substantially free of phase distortion.

2. A phantom full-bridge amplifier as set forth in claim 1 wherein the halves of said autotransformer are wound in multifilar winding with each other.

3. A phantom full-bridge amplifier as set forth in claim 1 or 2 provided overall linearizing feedback by transformerless means including:

a balanced-to-single-ended signal converter having inverting and non-inverting input terminals to which respective ones of said first and second load terminals are connected and having an output terminal for providing a feedback signal proportional to the difference between the output voltages at said first and second load terminals; and means for combining said feedback signal with said input signal.

4. A phantom full-bridge amplifier for supplying oppositely-phased push-pull drives to first and second ends of a load, for permitting the first and second ends of said load to be driven sufficiently to provide an output voltage across said load with a range substantially four times as large as a restricted difference available between reference and operating potentials, said phantom full-bridge amplifier comprising:

first and second supply terminals for receiving said operating and reference potentials, respectively;

first and second load terminals for connection to the first and second ends, respectively, of said load;

an input signal terminal;

first and second transistor means of the same conductivity type each having respective input and output and common electrodes;

means for maintaining the common electrodes of said first and second transistor means substantially at said reference potential, including first direct current conductive means connecting the common electrode of said first transistor means to said second supply terminal, and second direct current conductive means connecting the common electrode of said second transistor means to said second supply terminal;

direct coupled amplifier means with input connection at said input signal terminal and with output connections at the input electrodes of said first and second transistor means, including push-pull driver means responsive to an input signal for supplying push-pull signals to the input electrodes of said first and second transistor means, said push-pull driver means being of a type such that said push-pull signals are developed responsive to said input signal by transformerless means for avoiding phase shift through said push-pull driver means, such that excursions of said input signal in a first sense render said first transistor means more conductive and said second transistor means less conductive, such that sufficiently large excursions of input signal in said first sense render said second transistor means non-conductive, such that excursions of input signal in a second sense opposite to the first sense render said first transistor means less conductive and said second transistor means more conductive, and such that sufficiently large excursions of input signal in said second sense render said first transistor means non-conductive;

means responsive substantially solely to the currents flowing through the output electrodes of said first and second transistor means for providing oppositely-phased push-pull drives at said first and second load terminals, respectively, essentially consisting of a step-up autotransformer winding having a first half connected between said first load terminal and said first load terminal and said first supply terminal, having a second half connected between said second load terminal and said first supply terminal, and having the output electrodes of said first and second transistor means respectively connected to points in its first and second halves equally and sufficiently remote from their connections to said first supply terminal so that the self inductance thereof is sufficient for producing a voltage across said load of said range; said autotransformer being the sole transformer in said phantom full-bridge amplifier;

a balanced-to-single-ended signal converter having inverting and non-inverting input terminals to which respective ones of said first and second load terminals are connected and having an output terminal for providing by further transformerless means a feedback signal prioportional to the difference between the output voltages at said first and second load terminals; and still further transformerless means for combining said feedback signal with said input signal.

* * * * *